United States Patent
Yu (12)

(10) Patent No.: US 6,406,986 B1
(45) Date of Patent: Jun. 18, 2002

(54) FABRICATION OF A WIDE METAL SILICIDE ON A NARROW POLYSILICON GATE STRUCTURE

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/603,046

(22) Filed: Jun. 26, 2000

(51) Int. Cl.$^7$ .......................................... H01L 21/3205
(52) U.S. Cl. ...................................................... 438/592
(58) Field of Search ............................... 438/581–583, 438/630, 649–651, 655, 664, 682, 671, 755; 257/388, 412, 413, 456

(56) References Cited

U.S. PATENT DOCUMENTS

| | | | |
|---|---|---|---|
| 5,889,331 A | 3/1999 | Bai | 257/768 |
| 6,010,954 A | * 1/2000 | Ho et al. | 438/596 |
| 6,060,387 A | 5/2000 | Shepela et al. | 438/630 |
| 6,153,485 A | * 11/2000 | Pey et al. | 438/305 |
| 6,221,760 B1 | * 4/2001 | Hamada | 438/630 |

* cited by examiner

Primary Examiner—Hoai V. Ho
Assistant Examiner—Dung Anh Le
(74) Attorney, Agent, or Firm—Monica H. Choi

(57) ABSTRACT

A MOSFET has a drain region, a source region, and a channel region, and the MOSFET initially has a gate comprised of a capping layer on a polysilicon structure disposed on a gate dielectric over the channel region. A drain silicide and a source silicide having a first silicide thickness are formed in the drain region and the source region, respectively. A dielectric layer is deposited over the drain region, the source region, and the gate. The dielectric layer is polished until the capping layer of the gate is exposed such that the capping layer and the first dielectric layer are substantially level. The capping layer on the polysilicon structure of the gate is etched away such that the top of the polysilicon structure is exposed. A top portion of the first dielectric layer is etched away until sidewalls at a top portion of the polysilicon structure are exposed. A polysilicon spacer is formed at the exposed sidewalls at the top portion of the polysilicon structure. A silicidation metal is deposited on the top of the polysilicon structure that is exposed and on the polysilicon spacer. A silicidation anneal is performed with the silicidation metal and the polysilicon structure that is exposed and the polysilicon spacer to form a gate silicide having a second silicide thickness on top of the polysilicon structure of the gate. Because the gate silicide is formed with the added polysilicon spacer at the exposed sidewalls of the polysilicon structure, the gate silicide has a width that is larger than a width of the polysilicon structure of the gate. In addition, the gate silicide is formed in a separate step from the step for forming the drain silicide and the source silicide such that the gate silicide may have a larger thickness and be comprised of different metal silicide material from that of the drain silicide and the source silicide.

9 Claims, 4 Drawing Sheets

US 6,406,986 B1

FABRICATION OF A WIDE METAL SILICIDE ON A NARROW POLYSILICON GATE STRUCTURE

TECHNICAL FIELD

This invention relates to MOSFETs (Metal Oxide Semiconductor Field Effect Transistors), and more particularly to fabrication of a wide metal silicide on a narrow polysilicon gate structure of a MOSFET for a gate with low series resistance in MOSFETs with scaled down dimensions.

BACKGROUND OF THE INVENTION

Referring to FIG. 1, a cross sectional view of a conventional MOSFET (Metal Oxide Semiconductor Field Effect Transistor) 100 includes a drain region 102, a source region 104, and a channel region 106 fabricated on an insulating layer 107 disposed over a semiconductor substrate 108 for SOI (silicon-on-insulator) technology, as known to one of ordinary skill in the art of electronics. A gate dielectric 110 is disposed over the channel region 106 of the MOSFET 100. The MOSFET 100 also includes a gate comprised of a polysilicon structure 112 disposed over the gate dielectric 110. Spacer structures 113 typically formed of an insulating material surround the gate dielectric 110 and the polysilicon structure 112, as known to one of ordinary skill in the art of electronics. Isolation dielectric structures 120 electrically isolate the MOSFET 100 from other devices fabricated on the insulating layer 107.

For making contact to the drain region 102, the source region 104, and the polysilicon structure 112 of the gate, a metal silicide is formed on the drain region 102, the source region 104, and the polysilicon structure 112 of the gate. A drain silicide 114 is formed on the drain region 102, a source silicide 116 is formed on the source region 104, and a gate silicide 118 is formed on the polysilicon structure 112 of the gate of the MOSFET 100.

For efficiency in fabrication, the drain silicide 114, the source silicide 116, and the gate silicide 118 are typically fabricated simultaneously in the prior art. During the fabrication of the silicides, the drain region 102, the source region 104, and the polysilicon structure 112 are exposed, and metal is deposited on those regions. Then, a silicidation anneal is performed, and the drain silicide 114, the source silicide 116, and the gate silicide 118 form from a reaction of the deposited metal with silicon during the silicidation anneal. Thus, in the prior art, the drain silicide 114, the source silicide 116, and the gate silicide 118 have substantially the same thickness and is comprised of substantially the same metal silicide material.

However, as structures of the MOSFET are modified with advancement in technology, it may be desired that the thickness of the drain silicide 114 and the source silicide 116 be different from the thickness of the gate silicide 118. In addition, it may be desired that the metal silicide material for the drain silicide 114 and the source silicide 116 be different from the metal silicide material of the gate silicide 118.

For example, a long-recognized important objective in the constant advancement of monolithic IC (Integrated Circuit) technology is to enhance the speed performance of the integrated circuit. Thus, the MOSFET 100 is fabricated with SOI (silicon-on-insulator) technology whereby the drain region 102, the source region 104, and the channel region 106 are fabricated on the insulating layer 107 to eliminate junction capacitance, as known to one of ordinary skill in the art of electronics. Because the drain region 102 and the source region 104 are fabricated directly on the insulating layer 107, the depth of the drain region 102 and the source region 104 may be limited. In that case, the thickness of the drain silicide 114 and the source silicide 116 in turn are limited. On the other hand, a large thickness of the gate silicide 118 is desired for minimizing the resistance at the gate of the MOSFET and in turn for maximizing the speed performance of the MOSFET.

In addition, another long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, as the dimensions of the MOSFET 100 are scaled down, a smaller thickness is desired for the drain silicide 114 and the source silicide 116 to minimize small channel effects of the MOSFET, as known to one of ordinary skill in the art. On the other hand, a large thickness of the gate silicide 118 is desired for minimizing the resistance at the gate of the MOSFET and in turn for maximizing the speed performance of the MOSFET.

Some metal silicides, such as nickel silicide ($NiSi_2$), are more amenable for forming a thin metal silicide. Thus, it may be desired that the drain silicide 114 and the source silicide 116 be comprised of nickel silicide ($NiSi_2$). Other metal silicides, such as cobalt silicide ($CoSi_2$) or titanium silicide ($TiSi_2$), are more amenable for forming a thick metal silicide. Thus, it may be desired that the gate silicide 118 be comprised of cobalt silicide ($CoSi_2$) or titanium silicide ($TiSi_2$) while the drain silicide 114 and the source silicide 116 may be comprised of nickel silicide ($NiSi_2$) such that the gate silicide 118 is comprised of a different metal silicide material from that of the drain silicide 114 and the source silicide 116.

Furthermore, with scaling down of the dimensions of the polysilicon structure 112 of the MOSFET, the volume of the gate silicide 118 is also scaled down resulting in higher series resistance at the gate of the MOSFET 100. Such higher series resistance degrades the speed performance of the MOSFET.

Thus, a gate silicide is desired to have a larger thickness than that of the drain silicide and the source silicide, and to be comprised of a metal silicide material that may be different from that for the drain silicide and the source silicide. In addition, a gate silicide is desired to have a larger width than that of the narrow polysilicon gate structure in a MOSFET with scaled down dimensions.

SUMMARY OF THE INVENTION

Accordingly, the present invention is directed to a separate step for fabrication of the gate silicide from the step for fabrication of the drain silicide and the source silicide such that the gate silicide may have a different thickness and be comprised of different metal silicide material from that of the drain silicide and the source silicide. In addition, additional polysilicon material is added to the polysilicon gate for fabrication of a gate silicide having a larger width that the width of the narrow polysilicon gate structure in a MOSFET with scaled down dimensions.

Accordingly, in a general aspect of the present invention, a MOSFET has a drain region, a source region, and a channel region, and the MOSFET initially has a gate comprised of a capping layer on a polysilicon structure disposed on a gate dielectric over the channel region. A drain silicide and a source silicide having a first silicide thickness are formed in the drain region and the source region, respectively, of the MOSFET. A dielectric layer is deposited over the drain region, the source region, and the gate. The dielectric layer is polished down over the drain region, the source region, and the gate until the capping layer of the gate is exposed such that the capping layer and the dielectric layer are substantially level. The capping layer on the polysilicon structure of the gate is etched away such that the top of the polysilicon structure is exposed. A top portion of the dielectric layer is etched away until sidewalls at a top portion of the polysilicon structure are exposed. A polysilicon spacer is formed at the exposed sidewalls at the top portion of the polysilicon structure. A silicidation metal is deposited on the top of the polysilicon structure that is exposed and on the polysilicon spacer. A silicidation anneal is performed with the silicidation metal and the polysilicon structure that is exposed and the polysilicon spacer to form a gate silicide having a second silicide thickness on top of the polysilicon structure of the gate.

In this manner, because the gate silicide is formed with the added polysilicon spacer at the exposed sidewalls of the polysilicon structure, the gate silicide has a width that is larger than the width of the polysilicon structure of the gate. In addition, the gate silicide is formed in a separate step from the step of forming the drain silicide and the source silicide such that the gate silicide may have a larger thickness and be comprised of different metal silicide material from that of the drain silicide and the source silicide. The larger width and the larger thickness of the gate silicide results in minimized resistance at the gate of the MOSFET for enhanced speed performance of the MOSFET.

These and other features and advantages of the present invention will be better understood by considering the following detailed description of the invention which is presented with the attached drawings.

BRIEF DESCRIPTION OF THE DRAWINGS

In addition, FIGS. 2, 3, 4, 5, 6, 7, 8, 9, 10, and 11 illustrate the addition of polysilicon spacers to the polysilicon gate for fabrication of a gate silicide having a larger width than the width of the narrow polysilicon gate structure in a MOSFET with scaled down dimensions.

The figures referred to herein are drawn for clarity of illustration and are not necessarily drawn to scale. Moreover, the figures referred to herein show a MOSFET that is typically part of a larger integrated circuit. Elements having the same reference number in FIGS. 1, 2, 3, 4, 5, 6, 7, 8, 9, 10, and 11 refer to elements having similar structure and function.

DETAILED DESCRIPTION

Figure 1:
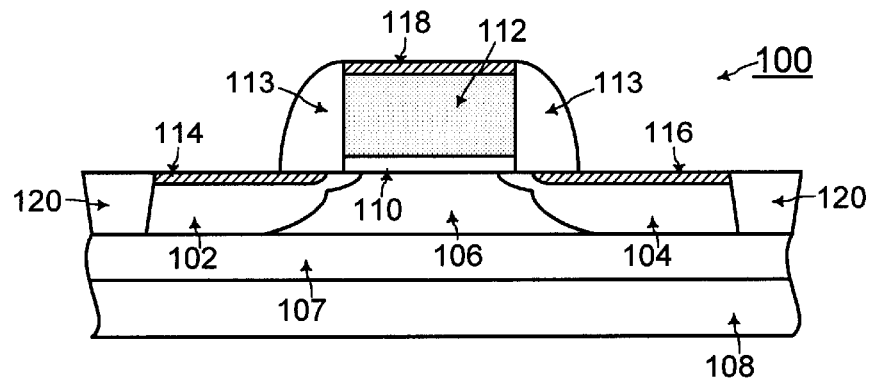
FIG. 1 shows a cross sectional view of a conventional MOSFET of the prior art.
Figure 2:
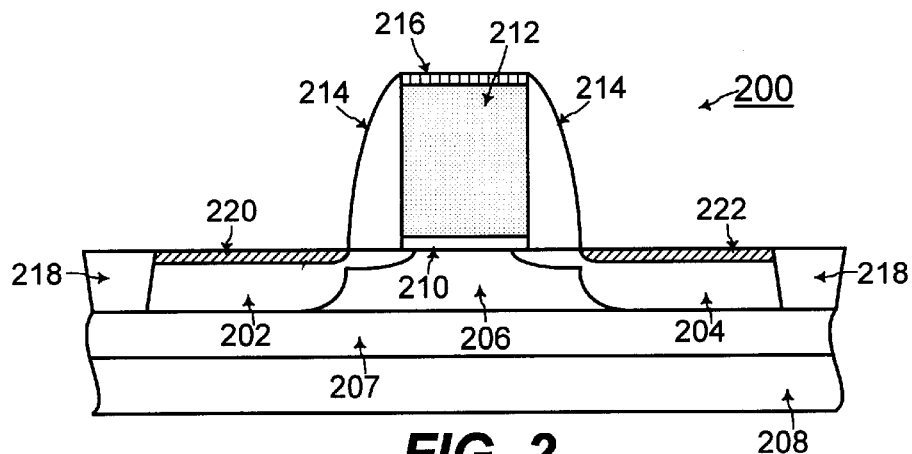
FIGS. 2, 3, 4, 5, 6, 7, 8, 9, 10, and 11 show cross sectional views of a MOSFET of an embodiment of the present invention, with a separate step for fabrication of the gate silicide from the step for fabrication of the drain silicide and the source silicide such that the gate silicide may have a larger thickness and be comprised of different metal silicide material from that of the drain silicide and the source silicide.

Referring to FIG. 2, a MOSFET 200 of an embodiment of the present invention includes a drain region 202, a source region 204, and a channel region 206 fabricated on an insulating layer 207 in SOI (silicon-on-insulator) technology. The insulating layer 207 is deposited on a semiconductor substrate 208, and the drain region 202, the source region 204, and the channel region 206 are fabricated on the insulating layer 207 to minimize junction capacitance, as known to one of ordinary skill in the art of electronics. However, the present invention may also be practiced when the drain region 202, the source region 204, and the channel region 206 are fabricated within the semiconductor substrate 208.

A first type of dopant within the drain region 202 and the source region 204 may be an N-type dopant, and a second type of dopant within the channel region 206 may be a P-type dopant, for fabricating an NMOSFET (N-channel Metal Oxide Semiconductor Field Effect Transistor). Alternatively, the first type of dopant within the drain region 202 and the source region 204 may be a P-type dopant, and a second type of dopant within the channel region 206 may be an N-type dopant, for fabricating a PMOSFET (P-channel Metal Oxide Semiconductor Field Effect Transistor).

A gate dielectric 210 is disposed over the channel region 206 of the MOSFET 200. The MOSFET 200 also includes a gate comprised of a polysilicon structure 212 disposed over the gate dielectric 210. Spacer structures 214 typically formed of an insulating material surround the gate dielectric 210 and the polysilicon structure 212, as known to one of ordinary skill in the art of electronics. A capping layer 216 comprised of a hardmask material such as siliconoxynitride (SiON) is disposed over the top of the polysilicon structure 212. Isolation dielectric structures 218 electrically isolate the MOSFET 200 from other devices fabricated on the insulating layer 207.

Referring to FIG. 2, a drain silicide 220 and a source silicide 222 having a first silicide thickness are formed in the drain region 202 and the source region 204, respectively, of the MOSFET 200. Processes for formation of the drain silicide 220 in the drain region 202 and the source silicide 222 in the source region 204 are known to one of ordinary skill in the art of integrated circuit fabrication.

The drain silicide 220 and the source silicide 222 are formed to have a relatively small thickness in the drain region 202 and the source region 204, respectively. Such small thickness minimizes undesired short channel effects when the MOSFET 200 has scaled down dimensions, as known to one of ordinary skill in the art of integrated circuit fabrication. In addition, the small thickness for the drain silicide 220 and the source silicide 222 is desired such that the drain silicide 220 and the source silicide 222 do not reach down to the insulating layer 207 within the drain region 202 and the source region 204, respectively, in SOI (silicon-on-insulator) technology. The drain silicide 220 and the source silicide 222 are preferably comprised of a metal silicide, such as nickel silicide ($NiSi_2$), that is amenable for formation of a relatively thin metal silicide.

Figure 3:
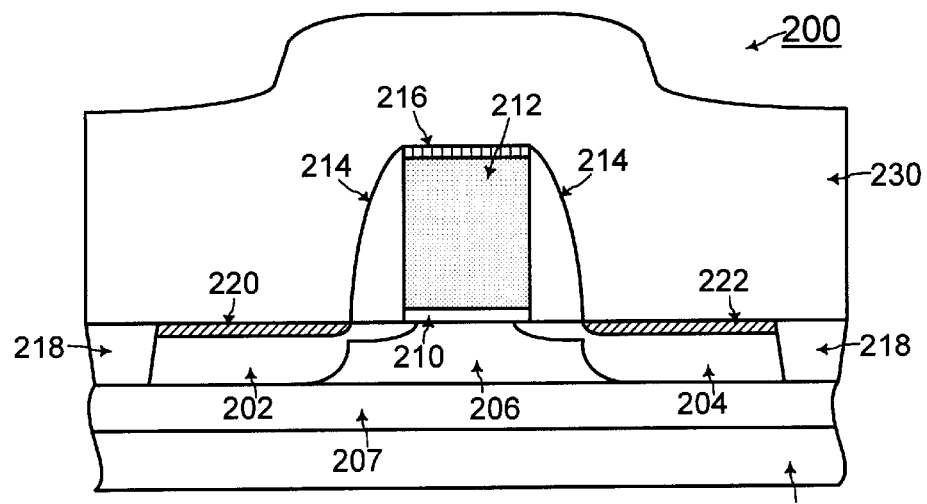

The capping layer 216 prevents formation of any metal silicide in the polysilicon structure 212 during formation of the drain silicide 220 in the drain region 202 and the source silicide 222 in the source region 204. Referring to FIG. 3, for formation of a gate silicide having a relatively large width and thickness, according to an embodiment of the present invention, a first dielectric layer 230 having a thickness in a range of from about 4000 Å (angstroms) to about 6000 Å (angstroms) is deposited over the drain region 202, the source region 204, and the gate of the MOSFET 200. The first dielectric layer 230 is comprised of a dielectric material such as silicon dioxide ($SiO_2$) for example.

Figure 4:
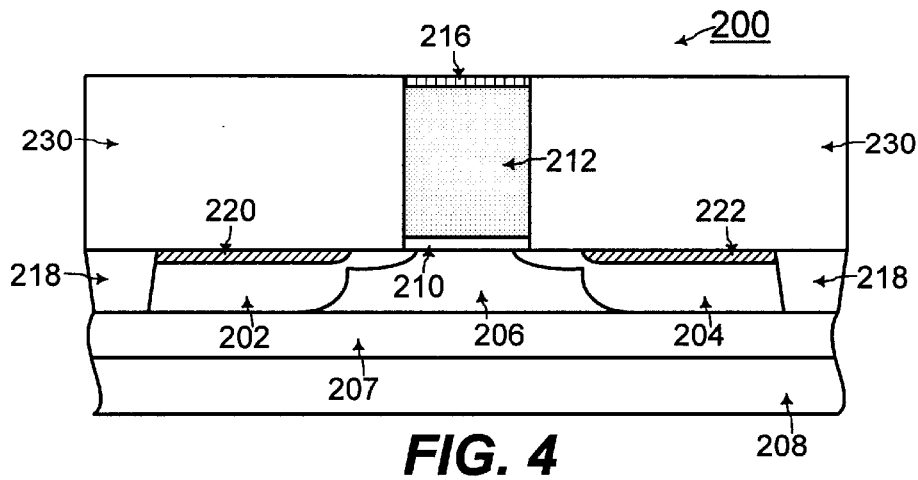

Referring to FIG. 4, the first dielectric layer 230 over the drain region 202, the source region 204, and the gate is polished down until the capping layer 216 is exposed such that the capping layer 216 and the dielectric layer 230 are substantially level. The capping layer 216 which is typically comprised of a hardmask material such as siliconoxynitride (SiON) may act as the stopping layer in the polishing process. Processes for thus polishing the first dielectric layer 230, such as (CMP) chemical mechanical polishing, are known to one of ordinary skill in the art of integrated circuit fabrication.

Figure 5:
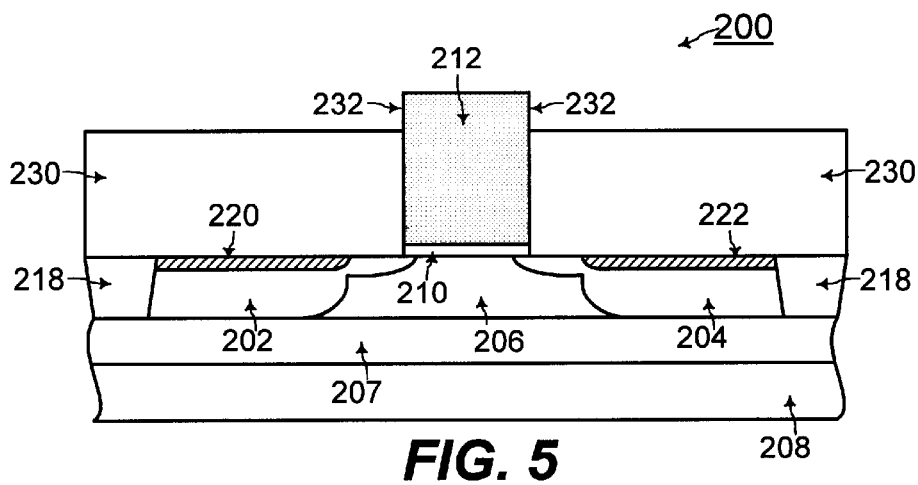

Referring to FIG. 5, the capping layer 216 is etched away to expose the top of the polysilicon structure 212. In addition, a top portion of the first dielectric layer 230 is etched away such that sidewalls 232 of the polysilicon structure 212 at the top portion of the polysilicon structure 212 are exposed. Processes for etching away the capping layer 216, which may be comprised of siliconoxynitride for example, and the first dielectric layer 230, which may be comprised of silicon dioxide ($SiO_2$) for example, are known to one of ordinary skill in the art of integrated circuit fabrication.

Figure 6:
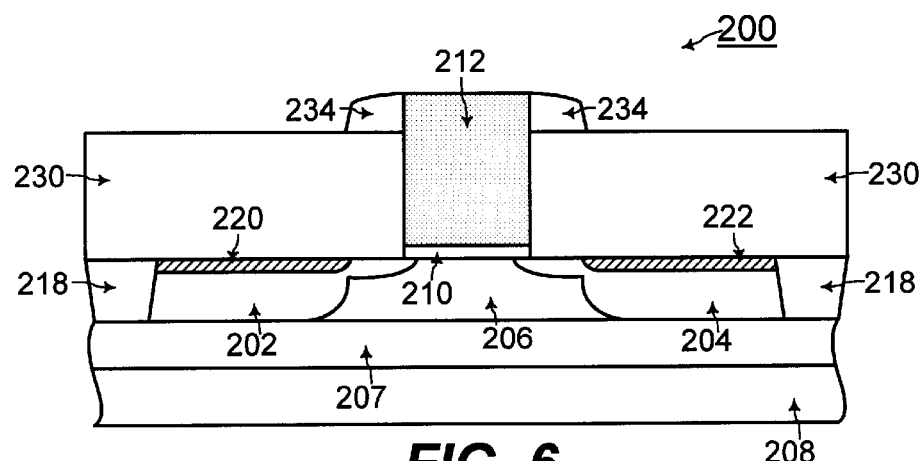

Referring to FIGS. 5 and 6, polysilicon spacers 234 are formed at the exposed sidewalls 232 at the top portion of the polysilicon structure 212. Processes for formation of such polysilicon spacers 234 such as a deposition and etch-back process are known to one of ordinary skill in the art of integrated circuit fabrication.

Figure 7:
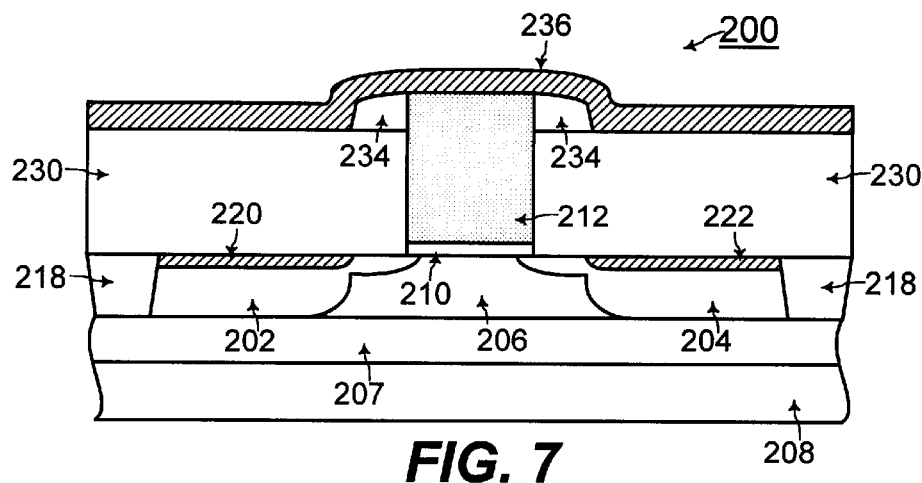
Figure 8:
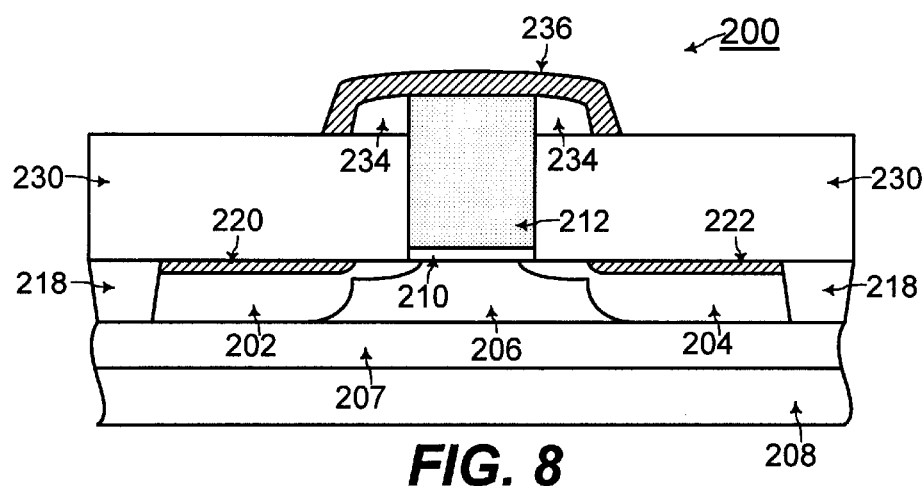

Referring to FIGS. 6 and 7, a silicidation metal 236 is deposited to cover the top of the polysilicon structure 212 and the polysilicon spacers 234. The silicidation metal 236 is used for forming the gate silicide. Referring to FIGS. 7 and 8, the silicidation metal is etched away substantially from the first dielectric layer 230 such that the silicidation metal remains to cover the top of the polysilicon structure 212 and the polysilicon spacers 234. Processes for deposition and patterning and etching of the silicidation metal 236, such as when the silicidation metal 236 is comprised of cobalt or tin, are known to one of ordinary skill in the art of integrated circuit fabrication.

Figure 9:
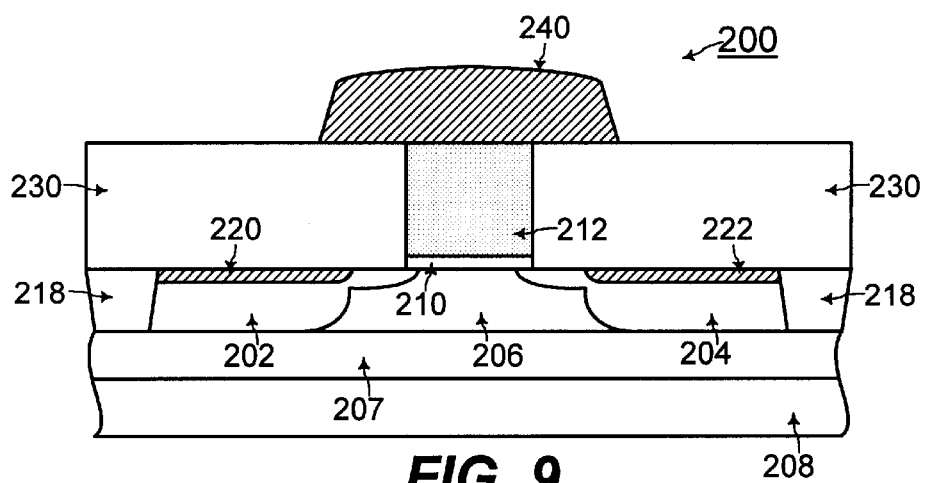

Referring to FIGS. 8 and 9, a silicidation anneal is performed with the silicidation metal 236 reacting with the polysilicon structure 212 that is exposed above the dielectric layer 230 and with the polysilicon spacers 234 to form a gate silicide 240 having a second silicide thickness on top of the polysilicon structure 212. Silicidation anneal processes are known to one of ordinary skill in the art of integrated circuit fabrication.

With the additional polysilicon spacers 234 extending beyond the sidewalls 232 of the polysilicon structure 212, the width of the gate silicide 240 is larger than the width of the polysilicon structure 212. This feature is especially advantageous for MOSFETs having scaled down dimensions in the tens of nanometers. A wider gate silicide 240 results in a higher volume of silicide which minimizes the resistance at the gate of the MOSFET 200 to enhance the speed performance of the MOSFET 200.

In addition, comparing the gate silicide 240 to the drain silicide 220 and the source silicide 222, the second silicide thickness of the gate silicide 240 is relatively larger than the first silicide thickness of the drain silicide 220 and the source silicide 222. Referring to FIG. 5, the thickness of the gate silicide 240 may be determined by controlling the height of the polysilicon structure 212 that is exposed after the top portion of the first dielectric layer 230 is etched away. The second silicide thickness of the gate silicide 240 is controlled to be larger than the first silicide thickness of the drain silicide 220 and the source silicide 222. Such thicker gate silicide 240 is advantageous for minimizing resistance at the gate of the MOSFET 200 to enhance the speed performance of the MOSFET 200.

In addition, the gate silicide 240 is comprised of a metal silicide material, such as cobalt silicide ($CoSi_2$) or titanium silicide ($TiSi_2$), that is more amenable for formation of a thick metal silicide. Referring to FIG. 7, the silicidation metal 236 is cobalt or tin in one embodiment of the present invention.

In this manner, because the gate silicide 240 is formed in a separate step from the step for formation of the drain silicide 220 and the source silicide 222, the gate silicide 240 may be formed to have larger thickness than that of the drain silicide 220 and the source silicide 222. In addition, with such separate fabrication steps, the gate silicide may be comprised of a different metal silicide than that for the drain silicide 220 and the source silicide 222. By addition of the polysilicon spacer 234 to the sidewalls 232 of the polysilicon structure 212 of the gate, the gate silicide has a width that is larger than the width of the polysilicon structure 212.

The drain silicide 220 and the source silicide 222 are relatively thin such that short channel effects may be minimized in the MOSFET 200 having scaled down dimensions. At the same time, the gate silicide 240 is relatively thick and wide to minimize gate resistance at the gate of the MOSFET 200 to enhance the speed performance of the MOSFET 200.

Figure 10:
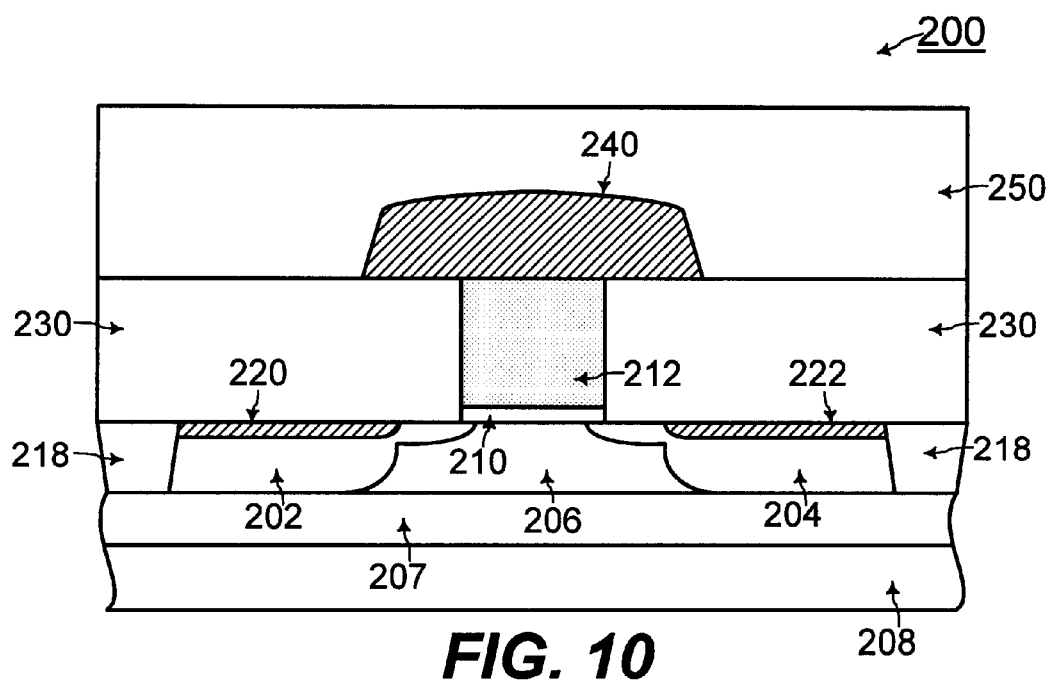
Figure 11:
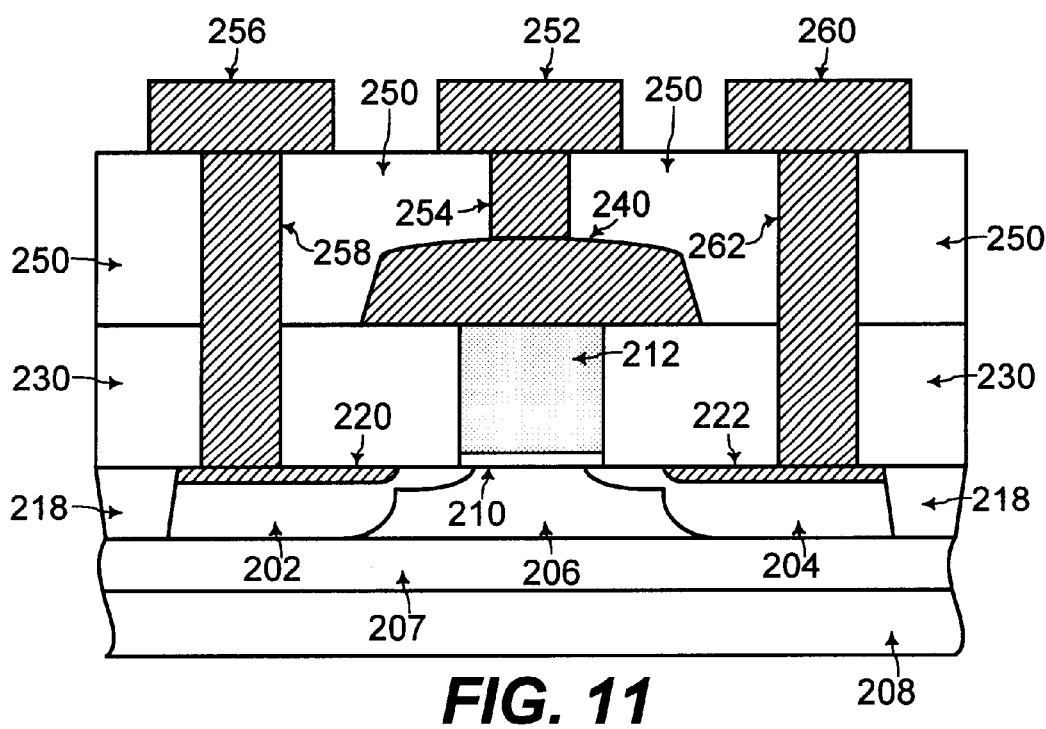

Referring to FIGS. 10 and 11, for formation of interconnect to the gate silicide, a second dielectric layer 250 is deposited over the gate silicide 240 and over the first dielectric layer 230. A gate interconnect 252 is formed on the second dielectric layer 250, and the gate interconnect 252 is conductively coupled to the gate silicide 240 with a gate via 254.

In addition, a drain interconnect 256 is formed on the second dielectric layer 250, and the drain interconnect 256 is conductively coupled to the drain silicide 220 with a drain via 258. Similarly, a source interconnect 260 is formed on the second dielectric layer 250, and the source interconnect 260 is conductively coupled to the source silicide 222 with a source via 262. Processes for formation of interconnects and vias are known to one of ordinary skill in the art of integrated circuit fabrication.

The foregoing is by way of example only and is not intended to be limiting. For example, any materials specified herein are by way of example only. As will be understood by those skilled in the art, the integrated circuit structures described herein may be made or used in the same way regardless of their position and orientation. Accordingly, it is to be understood that terms and phrases such as "sidewall," "top," "over," and "on," as used herein refer to the relative location and orientation of various portions of the structures with respect to one another, and are not intended to suggest that any particular absolute orientation with respect to external objects is necessary or required.

The invention is limited only as defined in the following claims and equivalents thereof.

I claim:

1. A method for fabricating a MOSFET (Metal Oxide Semiconductor Field Effect Transistor), said MOSFET having a drain region, a source region, and a channel region, and said MOSFET initially having a gate comprised of a capping layer on a polysilicon structure disposed on a gate dielectric over said channel region, the method including steps of:

A. forming a drain silicide in said drain region and forming a source silicide in said source region, said drain silicide and said source silicide having a first silicide thickness;

B. depositing a first dielectric layer over said drain region, said source region, and said gate;

C. polishing down said first dielectric layer over said drain region, said source region, and said gate until said capping layer of said gate is exposed such that said capping layer and said first dielectric layer are substantially level;

D. etching away said capping layer on said polysilicon structure of said gate such that the top of said polysilicon structure is exposed;

E. etching away a top portion of said first dielectric layer until sidewalls at a top portion of said polysilicon structure are exposed;

F. forming a polysilicon spacer at said exposed sidewalls at said top portion of said polysilicon structure;

G. depositing a silicidation metal on said top of said polysilicon structure that is exposed and on said polysilicon spacer; and H. performing a silicidation anneal with said silicidation metal and said polysilicon structure that is exposed and said polysilicon spacer to form a gate silicide having a second silicide thickness on top of said polysilicon structure of said gate;

wherein said gate silicide is formed from a silicidation reaction of said silicidation metal with substantially all of said polysilicon structure that is exposed and from a silicidation reaction of said silicidation metal with substantially all of said polysilicon spacer such that a thickness of said gate silicides is determined from consumption of substantially all of said polysilicon structure that is exposed and from consumption of substantially all of said polysilicon spacer, during said silicidation anneal of said step H;

and wherein said gate silicide has a width that is larger than a width of said polysilicon structure of said gate.

2. The method of claim 1, wherein said drain silicide and said source silicide are comprised of a different material from said gate silicide.

3. The method of claim 2, wherein said drain silicide and said source silicide are comprised of nickel silicide ($NiSi_2$), and wherein said gate silicide is comprised of one of cobalt silicide ($CoSi_2$) or titanium silicide ($TiSi_2$).

4. The method of claim 1, wherein said first silicide thickness of said drain silicide and said source silicide is smaller than said second silicide thickness of said gate silicide.

5. The method of claim 1, further including the steps of:
depositing a second dielectric layer over said gate silicide and over said first dielectric layer; and
forming a gate interconnect on said second dielectric layer, wherein said gate interconnect is conductively coupled to said gate silicide with a gate via through said second dielectric layer.

6. The method of claim 5, further including the steps of:
forming a drain interconnect on said second dielectric layer, wherein said drain interconnect is conductively coupled to said drain silicide with a drain via through said second dielectric layer and said first dielectric layer; and
forming a source interconnect on said second dielectric layer, wherein said source interconnect is conductively coupled to said source silicide with a source via through said second dielectric layer and said first dielectric layer.

7. The method of claim 1, wherein a first type of dopant within said drain region and said source region is an N-type dopant, and wherein a second type of dopant within said channel region is a P-type dopant for fabricating an NMOSFET (N-channel Metal Oxide Semiconductor Field Effect Transistor).

8. The method of claim 1, wherein a first type of dopant within said drain region and said source region is a P-type dopant, and wherein a second type of dopant within said channel region is an N-type dopant for fabricating a PMOSFET (P-channel Metal Oxide Semiconductor Field Effect Transistor).

9. A method for fabricating a MOSFET (Metal Oxide Semiconductor Field Effect Transistor), said MOSFET having a drain region, a source region, and a channel region, and said MOSFET initially having a gate comprised of a capping layer on a polysilicon structure disposed on a gate dielectric over said channel region, the method including steps of:

A. forming a drain silicide in said drain region and a source silicide in said source region, said drain silicide and said source silicide having a first silicide thickness;

B. depositing a first dielectric layer over said drain region, said source region, and said gate;

C. polishing down said first dielectric layer over said drain region, said source region, and said gate until said capping layer of said gate is exposed such that said capping layer and said first dielectric layer are substantially level;

D. etching away said capping layer on said polysilicon structure of said gate such that the top of said polysilicon structure is exposed;

E. etching away a top portion of said first dielectric layer until sidewalls at a top portion of said polysilicon structure are exposed;

F. forming a polysilicon spacer at said exposed sidewalls at said top portion of said polysilicon structure;

G. depositing a silicidation metal on said top of said polysilicon structure that is exposed and on said polysilicon spacer;

H. performing a silicidation anneal with said silicidation metal and said polysilicon structure that is exposed and said polysilicon spacer to form a gate silicide having a second silicide thickness on top of said polysilicon structure of said gate;

wherein said gate silicide has a width that is larger than a width of said polysilicon structure of said gate;

and wherein said drain silicide and said source silicide are comprised of a different material from said gate silicide;

and wherein said drain silicide and said source silicide are comprised of nickel silicide ($NiSi_2$), and wherein said gate silicide is comprised of one of cobalt silicide ($CoSi_2$) or titanium silicide ($TiSi_2$);

and wherein said first silicide thickness of said drain silicide and said source silicide is smaller than said second silicide thickness of said gate silicide;

I. depositing a second dielectric layer over said gate silicide and over said first dielectric layer;

J. forming a gate interconnect on said second dielectric layer, wherein said gate interconnect is conductively coupled to said gate silicide with a gate via through said second dielectric layer;

K. forming a drain interconnect on said second dielectric layer, wherein said drain interconnect is conductively coupled to said drain silicide with a drain via through said second dielectric layer and said first dielectric layer; and L. forming a source interconnect on said second dielectric layer, wherein said source interconnect is conductively coupled to said source silicide with a source via through said second dielectric layer and said first dielectric layer;

and wherein a first type of dopant within said drain region and said source region is an N-type dopant, and wherein a second type of dopant within said channel region is a P-type dopant for fabricating an NMOSFET (N-channel Metal Oxide Semiconductor Field Effect Transistor);

and wherein said first type of dopant within said drain region and said source region is a P-type dopant, and wherein said second type of dopant within said channel region is an N-type dopant for fabricating a PMOSFET (P-channel Metal Oxide Semiconductor Field Effect Transistor).

* * * * *